(12) United States Patent
Zeng et al.

(10) Patent No.: US 12,197,666 B2
(45) Date of Patent: Jan. 14, 2025

(54) DISPLAY PANEL AND DISPLAY APPARATUS

(71) Applicant: Shanghai Tianma Micro-Electronics Co., Ltd., Shanghai (CN)

(72) Inventors: Yang Zeng, Shanghai (CN); Zhe Li, Shanghai (CN); Jing Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/325,405

(22) Filed: May 30, 2023

(65) Prior Publication Data

US 2023/0297182 A1  Sep. 21, 2023

Related U.S. Application Data

(63) Continuation of application No. 17/830,211, filed on Jun. 1, 2022, now Pat. No. 11,703,970.

(30) Foreign Application Priority Data

Mar. 31, 2022 (CN) .......................... 202210336719.7

(51) Int. Cl.
*G06F 3/041* (2006.01)
*G06V 40/13* (2022.01)

(52) U.S. Cl.
CPC ............ *G06F 3/0412* (2013.01); *G06V 40/13* (2022.01)

(58) Field of Classification Search
CPC .............................. G06F 3/0412; G06V 40/13
See application file for complete search history.

(56) References Cited

U.S. PATENT DOCUMENTS 12,075,668 B2 * 8/2024 Liu ...................... G06F 3/0443
2022/0320237 A1 * 10/2022 Liu ...................... G02F 1/1333

FOREIGN PATENT DOCUMENTS

CN       111129100 A     5/2020
CN       111597892 A     8/2020

OTHER PUBLICATIONS

First Chinese Office Action mailed on Apr. 18, 2024, issued in the corresponding Chinese Application No. 202210336719.7, filed on Mar. 31, 2022, 9 pages.

* cited by examiner

*Primary Examiner* — Peter D McLoone
(74) *Attorney, Agent, or Firm* — CHRISTENSEN O'CONNOR JOHNSON KINDNESS PLLC

(57) ABSTRACT

A display panel and a display apparatus are provided. In an embodiment, the display panel has a display region including a fingerprint recognition region. In an embodiment, the fingerprint recognition region includes a plurality of light-transmitting apertures. In an embodiment, the display panel includes a plurality of sub-pixels, a plurality of touch electrodes, and a plurality of touch lines that are located in the display region. In an embodiment, one of the plurality of touch lines and one of the plurality of light-transmitting apertures are provided in different sub-pixel spacing regions of the plurality of sub-pixel spacing regions, respectively.

25 Claims, 13 Drawing Sheets

DISPLAY PANEL AND DISPLAY APPARATUS

CROSS-REFERENCE TO RELATED APPLICATION

This application is a continuation of U.S. patent application Ser. No. 17/830,211, filed on Jun. 1, 2022, which claims priority to Chinese Patent Application No. 202210336719.7, filed on Mar. 31, 2022. All of the above-mentioned patent applications are hereby incorporated by reference in their entireties.

TECHNICAL FIELD

The present disclosure relates to the field of display technologies, and, particularly, relates to a display panel and a display apparatus.

BACKGROUND

In recent years, display apparatuses with biometric recognition functions have gradually entered people's life and work. Fingerprint recognition technology has been widely applied in applications such as unlocking and secure payment due to a unique identity of fingerprints.

However, the display panel has a poor fingerprint recognition accuracy, and misjudgment occurs during recognition. Therefore, improving fingerprint recognition performance is an urgent technical problem to be solved.

SUMMARY

In a first aspect of the present disclosure, a display panel is provided. The display panel has a display region and includes a plurality of sub-pixels, a plurality of touch electrodes, and a plurality of touch lines that are located in the display region. The display region includes a fingerprint recognition region, and the fingerprint recognition region includes a plurality of light-transmitting apertures. The display region includes a plurality of sub-pixel spacing regions. One of the plurality of touch lines and one of the plurality of light-transmitting apertures are provided in different sub-pixel spacing regions of the plurality of sub-pixel spacing regions, respectively.

In a second aspect of the present disclosure, a display apparatus is provided. The display apparatus includes a display panel. The display panel has a display region and includes a plurality of sub-pixels, a plurality of touch electrodes, and a plurality of touch lines that are located in the display region. The display region includes a fingerprint recognition region, and the fingerprint recognition region includes a plurality of light-transmitting apertures. The display region includes a plurality of sub-pixel spacing regions. One of the plurality of touch lines and one of the plurality of light-transmitting apertures are provided in different sub-pixel spacing regions of the plurality of sub-pixel spacing regions, respectively.

BRIEF DESCRIPTION OF DRAWINGS

In order to better illustrate technical solutions of embodiments of the present disclosure, the accompanying drawings used in embodiments are briefly described below. The drawings described below are merely a part of the embodiments of the present disclosure. Based on these drawings, those skilled in the art can obtain other drawings.

DESCRIPTION OF EMBODIMENTS

In order to better understand the technical solutions of the present disclosure, the embodiments of the present disclosure are described in detail below with reference to the accompanying drawings.

It should be clear that the described embodiments are only some embodiments of the present disclosure, but not all of the embodiments. Based on the embodiments in the present disclosure, all other embodiments obtained by those of ordinary skill in the art without creative efforts fall within the protection scope of the present disclosure.

The terms used in the embodiments of the present disclosure are only for the purpose of describing specific embodiments, and are not intended to limit the present disclosure. As used in the embodiments of this application and the appended claims, the singular forms "a/an" "the" and "said" are intended to include the plural forms as well, unless the context clearly dictates otherwise.

It should be understood that the term "and/or" used in this document is only an association relationship to describe the associated objects, indicating that there can be three relationships, for example, A and/or B, which can indicate that A alone, A and B, and B alone. The character "/" in this document generally indicates that the related objects are an "or" relationship.

Conventionally, multiple light-transmitting apertures for fingerprint imaging are provided in the display panel in order to realize a fingerprint recognition function. However, due to the small size of such light-transmitting apertures, they are easily shielded by some metal layers in the display panel, resulting in less detection light entering through the light-transmitting apertures and poor fingerprint recognition accuracy.

Figure 1:
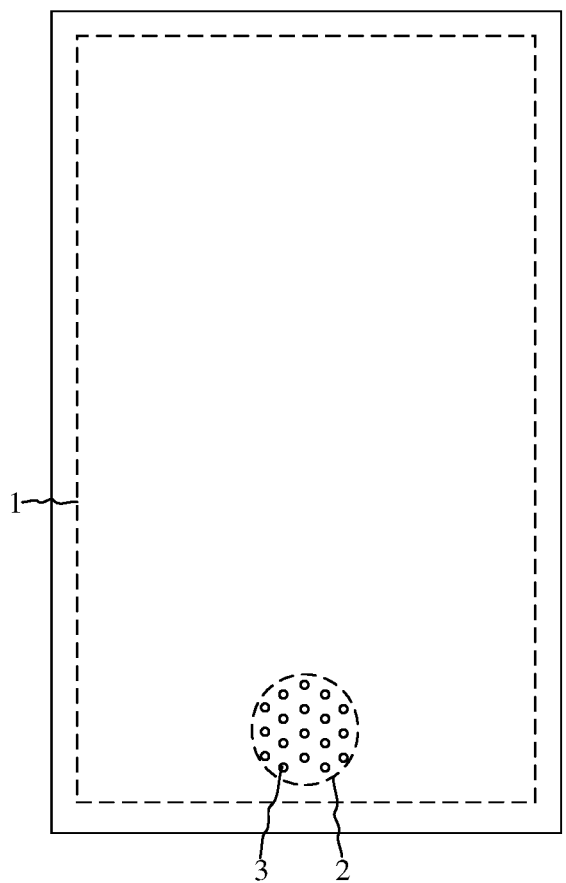
FIG. 1 is a top view of a display panel according to some embodiments of the present disclosure.

A display panel is provided in the present disclosure. FIG. 1 is a top view of a display panel according to some embodiments of the present disclosure. As shown in FIG. 1, the display panel includes a display region 1. The display region 1 includes a fingerprint recognition region 2. The fingerprint recognition region 2 includes a light-transmitting apertures for fingerprint imaging. A partial region or a whole region of the display region 1 can be reused into the fingerprint recognition region 2.

Figure 2:
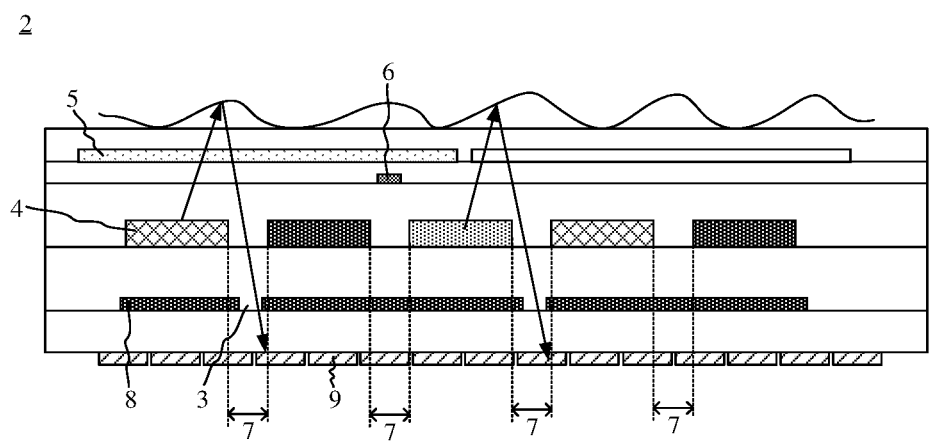
FIG. 2 is a partial cross-sectional view of a display panel according to some embodiments of the present disclosure.
Figure 3:
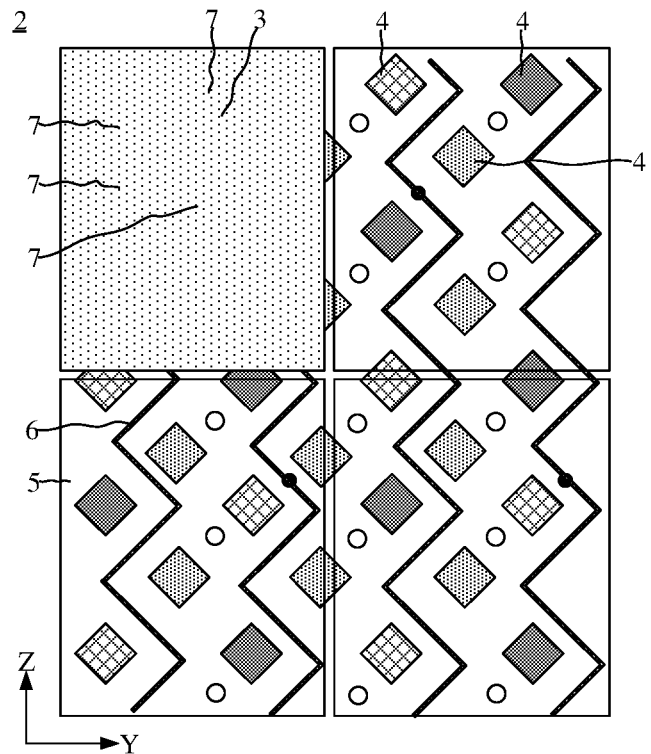
FIG. 3 is a partial schematic diagram of a display panel according to some embodiments of the present disclosure.

FIG. 2 is a partial cross-sectional view of a display panel according to some embodiments of the present disclosure, and FIG. 3 is a partial schematic diagram of a display panel according to some embodiments of the present disclosure. As shown in FIG. 2 and FIG. 3, the display panel further includes multiple sub-pixels 4 located in the display region 1, multiple touch electrodes 5 located in the display region 1, and multiple touch lines 6 located in the display region 1. The touch electrode 5 and the touch line 6 can be located at a side of the sub-pixel 4 toward a light-emitting direction of the display panel. The touch line 6 is electrically connected to the touch electrode 5 and is configured to transmit a touch detection signal sensed by the touch electrode 5 to a driving circuit, and the driving circuit is configured to determine a touch position of the finger according to the received touch detection signal. In some embodiments, the touch electrode 5 can be a self-capacitance touch electrode. Multiple touch electrodes 5 are independently arranged in a matrix. Each touch electrode 5 can be electrically connected to one touch line 6. When a finger touches a display screen, the capacitance of the finger is superimposed on the touch electrode 5, so that the capacitance sensed by the touch electrode 5 changes, and the touch position of the finger is determined according to the touch detection signals transmitted by the touch electrodes 5 at different positions.

The display region 1 includes a sub-pixel spacing region 7. The sub-pixel spacing region 7 is located between two adjacent sub-pixels 4, and is provided with at most one of the touch line 6 and the light-transmitting aperture 3.

In some embodiments of the present disclosure, referring to FIG. 2, a bottom metal layer 8 for shielding ambient light is provided at a side of the sub-pixel 4 away from the light-emitting direction of the display panel. The light-transmitting aperture 3 can be a through hole penetrating the bottom metal layer 8. When performing fingerprint recognition, the light emitted from the sub-pixel 4 can be used as the light for recognition and is transmitted to the finger and reflect by the finger, and the detection light reflected back passes through the light-transmitting aperture 3 and is incident to a photosensitive sensor 9 at the bottom of the display panel, and then the valleys and ridges of the fingerprint are recognized according to the intensity of the detection light collected by the photosensitive sensor 9 at different positions.

Figure 4:
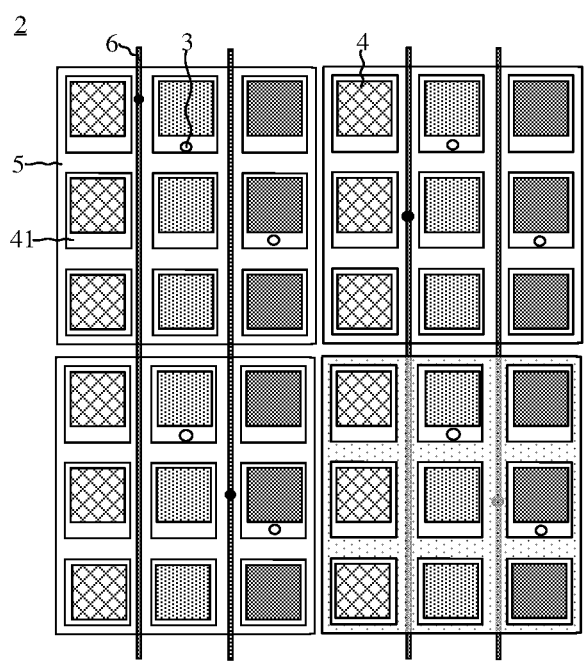
FIG. 4 is a schematic diagram of touch electrodes according to some embodiments of the present disclosure.

For a display panel with both touch and fingerprint recognition functions, when designing the touch electrodes 5 and the touch lines 6 in the display panel, in order to shield the sub-pixels 4 less, referring to FIG. 3 again, the touch electrode 5 can be a block electrode made of a light-transmitting conductive material such as indium tin oxide (Indium Tin Oxides, ITO). FIG. 4 is a schematic diagram of touch electrodes according to some embodiments of the present disclosure. In some embodiments, as shown in FIG. 4, the touch electrode 5 can also be a grid electrode made of a metal material. A hollow region of the touch electrode 5 exposes the sub-pixel 4. In order to reduce a voltage drop when the touch detection signal is transmitted on the touch line and improve the detection accuracy at the touch position, the touch line 6 is generally made of a metal material with low resistivity, and also has sufficient line width to reduce its resistance.

When the touch electrode 5 has a metal grid structure, the light-transmitting aperture 3 can be kept way directly by setting breakpoints on metal grids. Due to the structure feature of the metal grids, even if there are breakpoints at some positions, it will not be completely separated from the electrode body, so that the metal bars on the metal grid are connected to each other, thereby still achieving normal functions. However, for the touch line 6, if the touch line 6 is provided with a hollow region or a breakpoint, disconnection between the touch electrode 5 and the driving circuit may occur, and thus the touch detection signal cannot be transmitted normally, and it is difficult to make the touch line 6 to bypass the light-transmitting aperture 3. When the self-capacitive touch is used, the touch lines 6 can pass through the display region to be electrically connected to multiple touch electrodes 5 in a one-to-one correspondence, so that there are a large number of touch lines 6 in the display region, increasing a risk that the light-transmitting apertures 3 are blocked by the touch lines 6.

In the embodiments of the present disclosure, the extension manner of the touch line 6 cooperates with the arrangement of the light-transmitting apertures 3, so that only at most one of the touch line 6 and the light-transmitting aperture 3 is provided in the sub-pixel spacing region 7 located between any two adjacent sub-pixels 4. On the one hand, the touch line 6 and the light-transmitting aperture 3 are located in different sub-pixel spacing regions 7, since the distance between the touch line 6 and the light-transmitting aperture 3 is relatively far, even if deviations occur in the arrangement position of the touch line 6 and/or the arrangement position of the light-transmitting aperture 3 due to factors such as process errors, the touch line 6 cannot cover the light-transmitting aperture 3 to shield the light-transmitting aperture 3, thus improving the amount of detection light able to pass through the light-transmitting aperture 3, and improving the fingerprint recognition accuracy.

On the other hand, if the touch line 6 and the light-transmitting aperture 3 are located in a same sub-pixel spacing region 7, in order to achieve that the touch line 6 does not shield the light-transmitting aperture 3, either the touch line 6 is arranged as far away from the light-transmitting aperture 3 as possible, or a line width of the touch line 6 can be reduced. When the distance between the touch line and the light-transmitting aperture is increased, the touch line 6 and the light-transmitting aperture 3 tend to be closer to the sub-pixel 4, which makes it difficult to maintain a large distance between the sub-pixel 4 and each of the touch line 6 and the light-transmitting aperture 3, and it is easy to occur that the touch line 6 shields the sub-pixel 4, or the sub-pixel 4 shields the light-transmitting aperture 3. When the line width of the touch line 6 decreases, the resistance of the touch line 6 increases, resulting in a greater degree of attenuation of the touch detection signal. In the embodiments of the present disclosure, since the touch line 6 and the light-transmitting aperture 3 are located in different sub-pixel spacing regions 7, a sufficient distance can be achieved between the sub-pixel 4 and each of the touch line 6 and the light-transmitting aperture 3. Even if the positions of touch line 6 and light-transmitting aperture 3 are deviated, the touch line 6 will not shield the sub-pixel 4, or the sub-pixel 4 will not shield the light-transmitting aperture 3, and there is no need to reduce the line width of the touch line 6.

In other words, with the above configuration, while ensuring a sufficient distance between the sub-pixel 4 and each of the touch line 6 and the light-transmitting aperture 3, a distance between adjacent sub-pixels 4 can be reduced, so that the pixel density can be increased, or the line width of the touch line 6 is increased to reduce the resistance of the touch line 6 to optimize the touch performance.

Inside the display panel, the sub-pixel 4, the touch line 6, and the light-transmitting aperture 3 are located in different layers, respectively. The distance between any two of the touch line 6, the light-transmitting aperture 3, and the sub-pixel 4 in the present disclosure refers to a distance between the orthographic projections of the any two on a plane of the display panel. Exemplarily, the distance between the touch line 6 and the light-transmitting aperture 3 as described above refers to a distance between an orthographic projection of the touch line 6 on the plane of the display panel and an orthographic projection of the light-transmitting aperture 3 on the plane of the display panel.

Figure 5:
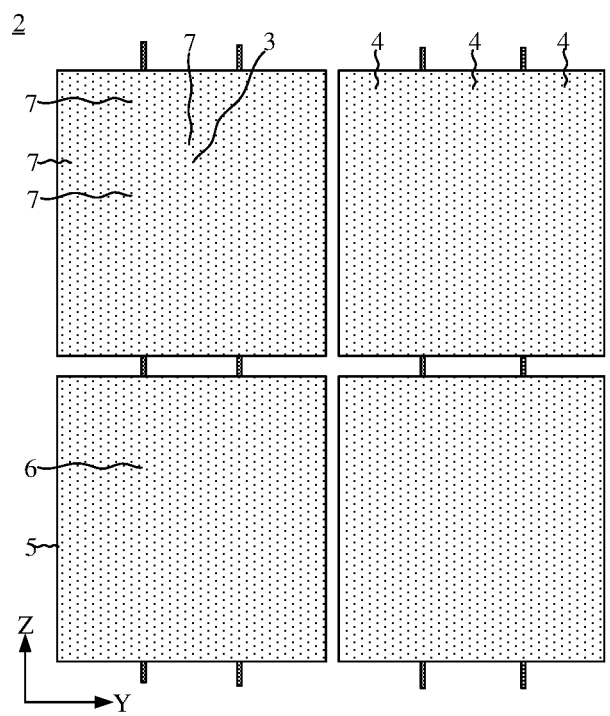
FIG. 5 is a schematic diagram of touch lines according to some embodiments of the present disclosure.

In some embodiments of the present disclosure, in a case where the touch line 6 and the light-transmitting aperture 3 are located in different sub-pixel spacing regions 7, the extending manner of the touch line 6 can be determined flexibly according to the arrangement manner of the sub-pixels 4. For example, referring to FIG. 3, when the sub-pixels 4 are not aligned in the second direction Y and/or the third direction Z, the touch line 6 can extend in a broken line. It can be understood that the touch line 6 extending in the broken line herein refers to an overall extending direction of the touch line 6, that is, from a top view of the display panel, a single touch line 6 as a whole extends in a vertical broken line. FIG. 5 is a schematic diagram of touch lines 6 according to some embodiments of the present disclosure. In some embodiments, as shown in FIG. 5, when the sub-pixels 4 are aligned with each other in the second direction Y and/or the third direction Z, the touch line 6 can extend in a straight line.

Figure 6:
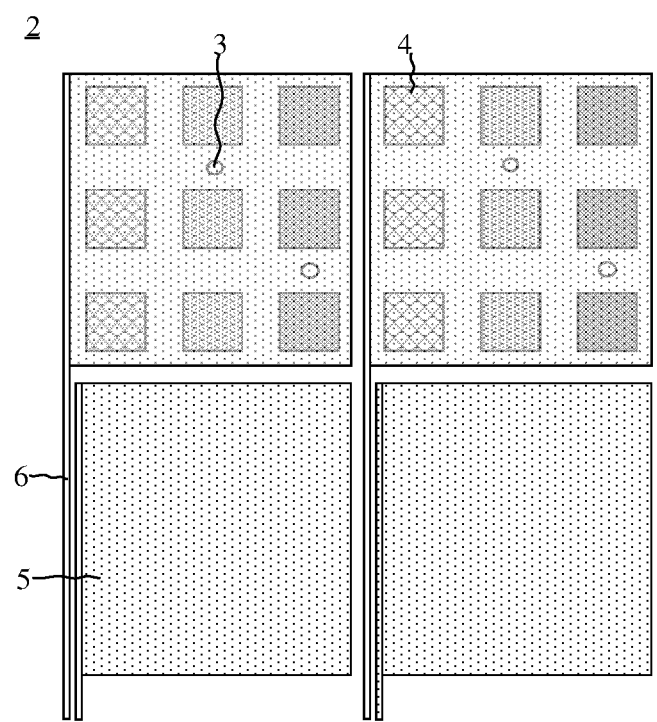
FIG. 6 is a schematic diagram showing layer positions of the touch electrodes and the touch lines according to some embodiments of the present disclosure.

In some embodiments of the present disclosure, the touch electrodes 5 and the touch lines 6 can be arranged in different layers. For example, referring to FIG. 2 and FIG. 3, the touch line 6 can be located at a side of the touch electrodes 5 away from the light-emitting direction of the display panel, and in this case, the touch electrodes 5 in the display panel can be electrode blocks with a same shape and area. FIG. 6 is a schematic diagram showing layer positions of the touch electrodes 5 and the touch lines 6 according to some embodiments of the present disclosure. In some embodiments, as shown in FIG. 6, the touch electrodes 5 and the touch lines 6 can be arranged in a same layer, and in this case, the touch line 6 are extend from a side of the touch electrode 5. When the touch electrodes 5 and the touch lines 6 are provided in a same layer, in order to bypass the touch lines 6, the touch electrodes 5 arranged along the extending direction of the touch line 6 can have different sizes. In some embodiments, as shown in FIG. 3, the touch line 6 includes first segments and second segments, wherein the first segment extends along the first direction, and the second segment extends along the fourth direction. In some embodiments, the first segments and the second segments are alternatively arranged to form the touch line 6 having a shape of a zigzag line.

Figure 7:
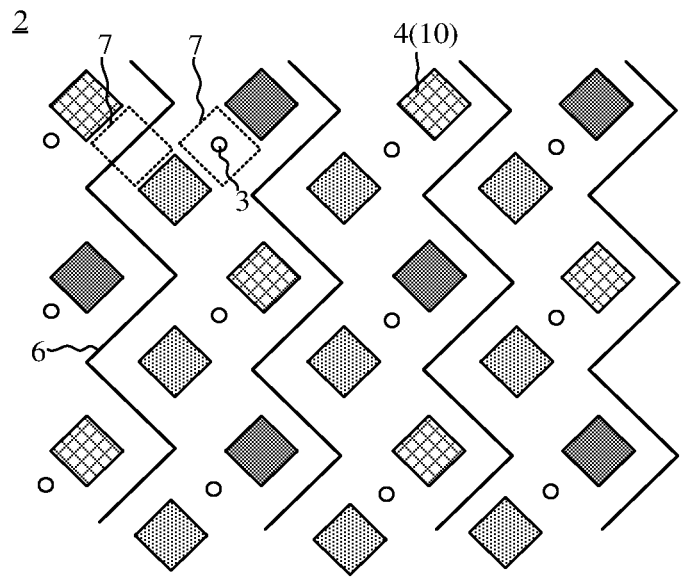
FIG. 7 is a schematic diagram showing arrangement positions of light-transmitting apertures according to some embodiments of the present disclosure.

FIG. 7 is a schematic diagram showing arrangement positions of light-transmitting apertures 3 according to some embodiments of the present disclosure. In some embodiments, as shown in FIG. 7, the sub-pixels 4 include first-type sub-pixel 10 located in the fingerprint recognition region 2. Multiple light-transmitting apertures 3 are provided in at least one sub-pixel spacing region 7 adjacent to the first-type sub-pixel 10.

With such configuration, the distribution density of the light-transmitting apertures 3 in the fingerprint recognition region 2 is relatively large, and at least one light-transmitting aperture 3 is arranged next to each first-type sub-pixel 10 in the fingerprint recognition region 2, so that after the light emitted by the first-type sub-pixel 10 is reflected back by the finger, it can be incident to the light sensor 9 through the light-transmitting aperture 3 beside it, thereby increasing the amount of detection light collected by the optical sensor.

Figure 8:
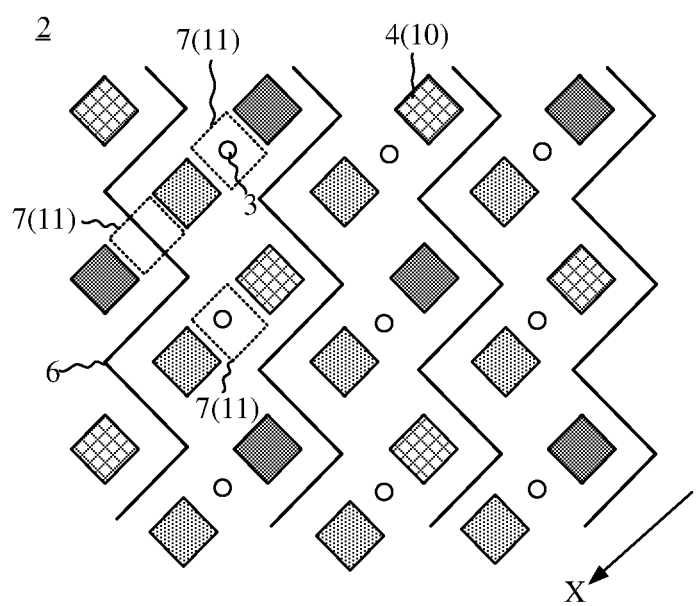
FIG. 8 is a schematic diagram showing arrangement positions of light-transmitting apertures according to another embodiment of the present disclosure.

FIG. 8 is a schematic diagram showing arrangement positions of light-transmitting apertures 3 according to another embodiment of the present disclosure. In some embodiments, as shown in FIG. 8, the sub-pixel 4 include a first-type sub-pixel 10 located in the fingerprint recognition region 2, And the sub-pixel spacing regions 7 include a first-type sub-pixel spacing region 11. The first-type sub-pixel spacing region 11 is located between two first-type sub-pixels 10 adjacent to each other in the first direction X. The light-transmitting aperture 3 is located in at least one first-type sub-pixel spacing region 11.

With such configuration, the light-transmitting aperture 3 is only located between two first-type sub-pixels 10 adjacent to each other in a direction. That is, the light-transmitting aperture 3 is provided at a side of the first-type sub-pixels 10 only in the first direction X, or the light-transmitting apertures 3 are provided at two side of the first-type sub-pixels 10 only in the first direction X. In this case, the light-transmitting apertures 3 in the fingerprint recognition region 2 are dispersed more uniformly, and it is avoided that the light-transmitting apertures 3 distributed beside a first-type sub-pixel 10 are arranged excessive densely while ensuring a high distribution density of the light-transmitting apertures 3, thereby avoiding the mutual interference of the detection light emitted through the adjacent light-transmitting apertures 3.

Figure 9:
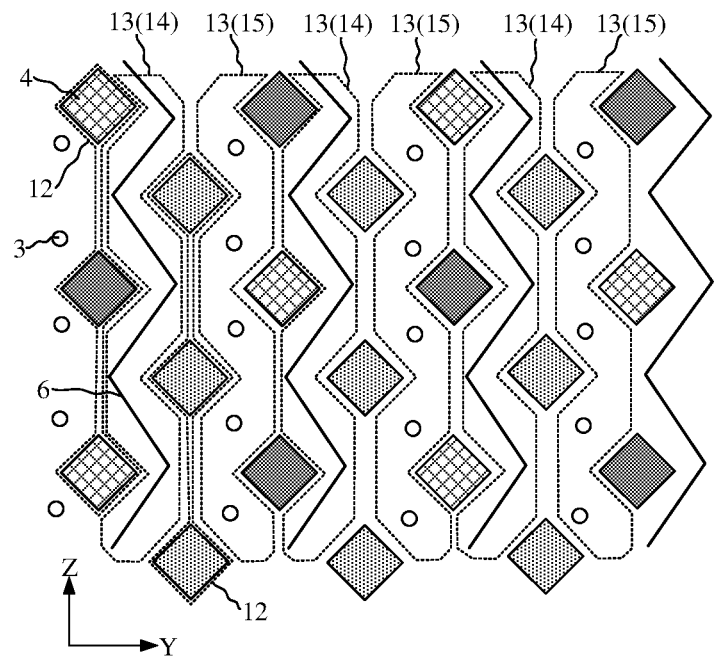
FIG. 9 is a schematic diagram showing arrangement positions of light-transmitting apertures according to another embodiment of the present disclosure.

FIG. 9 is a schematic diagram showing arrangement positions of light-transmitting apertures 3 according to another embodiment of the present disclosure. In some embodiments, as shown in FIG. 9, the display panel includes multiple pixel groups 12 arranged along a second direction Y. The pixel group 12 includes multiple sub-pixels 4 arranged along a third direction Z. The second direction Y intersects with the third direction Z. The sub-pixels 4 in two adjacent pixel groups 12 can be arranged in a staggering manner in the second direction Y.

The display region 1 includes pixel group spacing regions 13. The pixel group spacing region 13 is located between the sub-pixels 4 of two adjacent pixel groups 12. The pixel group spacing regions 13 include first-type pixel group spacing regions 14 and second-type pixel group spacing regions 15. The touch line 6 is located in the first-type pixel group spacing region 14. The light-transmitting aperture 3 is located in the second-type pixel group spacing region 15. With such configuration, the touch lines 6 and the light-transmitting apertures 3 are located in different pixel group spacing regions 13 respectively. That is, the touch line 6 and the light-transmitting aperture 3 occupy different columns. In this way, on the premise that the touch line 6 is far away from the light-transmitting aperture 3, the touch line 6 and the light-transmitting aperture 3 are arranged more regularly.

In some embodiments, referring to FIG. 9 again, the first-type pixel group spacing regions 14 and the second-type pixel group spacing regions 15 are alternately arranged along the second direction Y. In this case, the touch line 6 and the light-transmitting aperture 3 occupy different columns and are arranged in a staggered manner, and there is one first-type pixel group spacing region 14 between any two adjacent second-type pixel group spacing regions 15, so that it is avoided that the multiple second-type pixel group spacing regions 15 are concentratedly arranged, thereby reducing the degree of difference in the amount of detected light collected by optical sensors at different positions.

In some embodiments, the second-type pixel group spacing regions 15 are arranged at equal intervals. That is, the distances between any two adjacent second-type pixel group spacing regions 15 are the same. In this case, the light-transmitting apertures 3 are distributed more uniformly in the whole fingerprint recognition region 2, and the uniformity of the amount of detection light collected by the optical sensors at different positions of the fingerprint recognition region 2 is better.

In some embodiments, in order to improve the distribution uniformity of the light-transmitting apertures 3 in the second-type pixel group spacing region 15, the light-transmitting apertures 3 can also be arranged at equal intervals in the second-type pixel group spacing region 15. That is, the light-transmitting apertures 3 can be arranged at equal intervals along the extending direction of the second-type pixel group spacing region 15. The distances between any two adjacent light-transmitting apertures 3 in the second-type pixel group spacing region 15 are the same.

Figure 10:
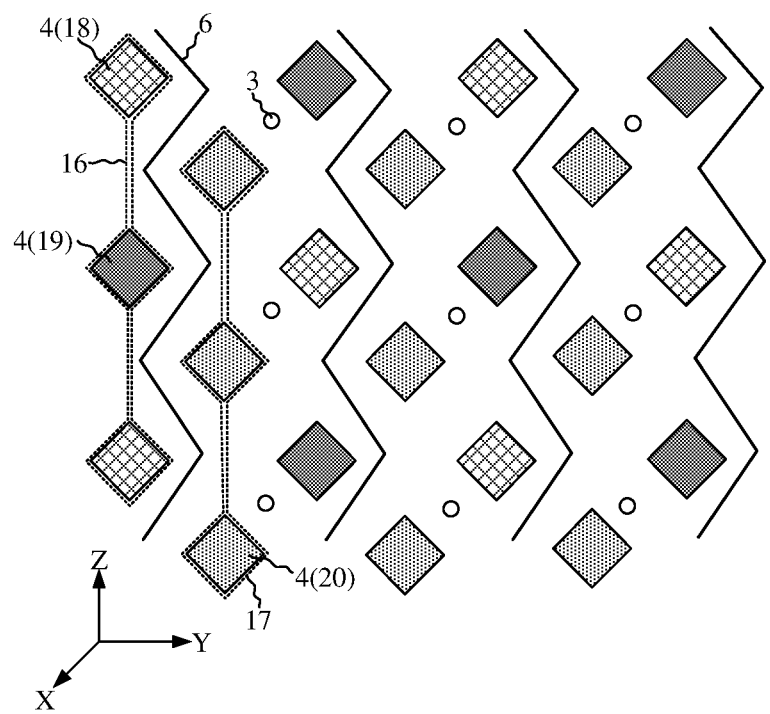
FIG. 10 is a schematic diagram showing arrangement positions of light-transmitting apertures according to another embodiment of the present disclosure.

FIG. 10 is a schematic diagram showing arrangement positions of light-transmitting apertures 3 according to another embodiment of the present disclosure. In some embodiments, as shown in FIG. 10, the pixel groups 12 include a first pixel group 16 and a second pixel group 17 that are arranged alternately along the second direction Y. The first pixel group 16 includes first sub-pixels 18 and second sub-pixels 19 arranged alternately along the third direction Z. The second pixel group 17 includes multiple third sub-pixels 20 arranged along the third direction Z. In the second direction Y, the third sub-pixel 20 is not aligned with the first sub-pixel 18 or the second sub-pixel 19.

The light-transmitting aperture 3 is located between the third sub-pixel 20 and the first sub-pixel 18 adjacent to the third sub-pixel 20 in the first direction X, and/or, located between the third sub-pixel 20 and the second sub-pixel 19 adjacent to the third sub-pixel 20 in the first direction X. The first direction X intersects with the second direction Y and the third direction Z.

The first sub-pixel 18 can be a red sub-pixel configured to emit red light, the second sub-pixel 19 can be a blue sub-pixel configured to emit blue light, and the third sub-pixel 20 can be a green sub-pixel configured to emit green light.

It can be understood that the luminous efficiency of sub-pixels emitting light of different colors are different due to the influence of the characteristics of the light-emitting material. Generally speaking, the luminous efficiency of the green sub-pixel is higher than the luminous efficiency of the red sub-pixel, and the luminous efficiency of the red sub-pixel is higher than the luminous efficiency of the blue sub-pixel. If the light-transmitting aperture 3 is arranged between two adjacent sub-pixels emitting light of a same color, and if the luminous efficiency of the sub-pixel of this color is high, the brightness of the reflected light of this color is excessively high to exceed the fingerprint recognition ability. However, if the luminous efficiency of the color sub-pixel is low, the brightness of the reflected light of this color is too low to be recognized.

In view of the above, in the embodiments of the present disclosure, based on the arrangement of the sub-pixels 4 and the arrangement positions of the light-transmitting apertures 3, the light-transmitting aperture 3 is located between two adjacent sub-pixels of different colors, and after light emitted from the two sub-pixels of different colors is reflected back by the finger, the brightness of the reflected light of the two colors can be neutralized, so that the brightness of the reflected light is prevented from being excessively high or excessively low, thereby optimizing the recognition effect.

Figure 11:
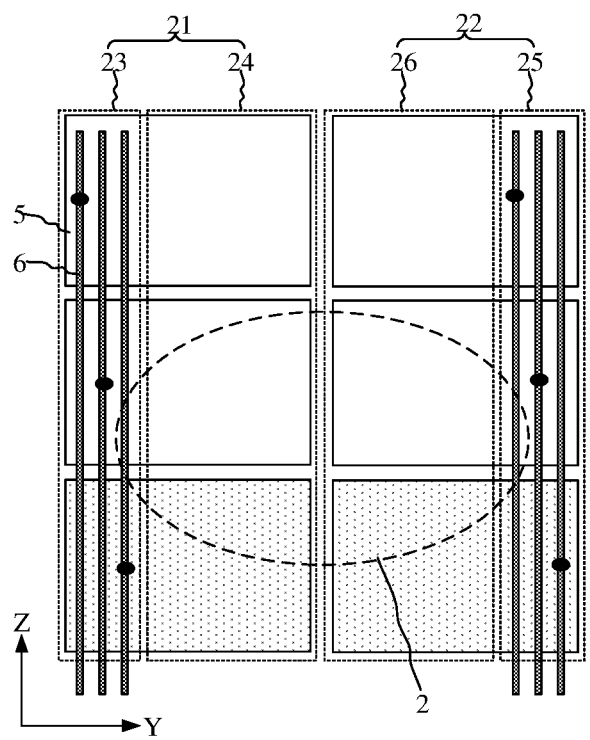
FIG. 11 is a schematic diagram showing arrangement positions of touch lines according to some embodiments of the present disclosure.
Figure 12:
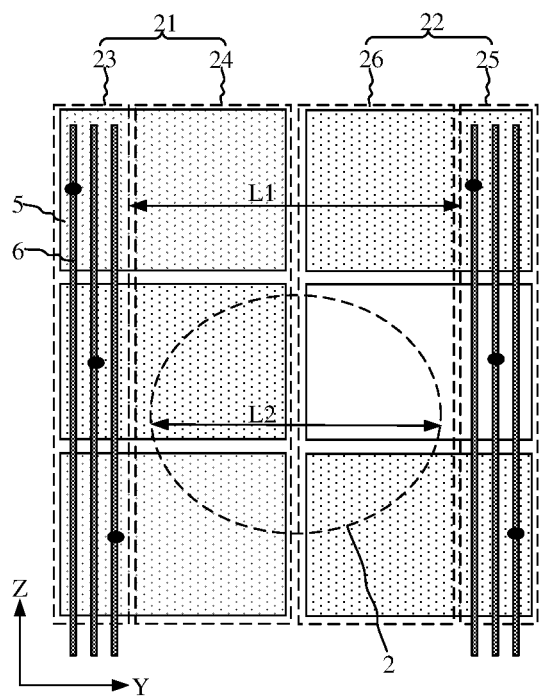
FIG. 12 is a schematic diagram showing arrangement positions of touch lines according to another embodiment of the present disclosure.

FIG. 11 is a schematic diagram showing arrangement positions of touch lines 6 according to some embodiments of the present disclosure, and FIG. 12 is a schematic diagram showing arrangement positions of touch lines 6 according to another embodiment of the present disclosure. In some embodiments, as shown in FIG. 11 and FIG. 12, the display region 1 includes a first region 21 and a second region 22 that are adjacent to each other in the second direction Y. The first region 21 includes a first lead region 23 and a first non-lead region 24 that are arranged along the second direction Y. The second region 22 includes a second lead region 25 and a second non-lead region 26 that are arranged along the second direction Y. The first non-lead region 24 and the second non-lead region 26 are adjacent to each other.

The touch line 6 electrically connected to the touch electrode 5 in the first region 21 is located in the first lead region 23. The touch line 6 electrically connected to the touch electrode 5 in the second region 22 is located in the second lead region 25. A part of the fingerprint recognition region 2 is located in the first non-lead region 24, and another part of the fingerprint recognition region 2 is located in the second non-lead region 26. FIG. 11 shows a situation where parts of the fingerprint recognition region 2 are located in the first non-lead region 24, the second non-lead region 26, the first lead region 23, and the second lead region 25, respectively. FIG. 12 shows a part of the fingerprint recognition region 2 is located in the first non-lead region 24 and the remaining part of the fingerprint recognition region 2 is located in the second non-lead region 26.

With such configuration, the touch lines 6 in the first region 21 are concentrated in the first lead region 23 away from the second region 22, and the touch lines 6 in the second region 22 are concentrated in the second lead region 25 away from the first region 21, so that no touch lines 6 extend in the first non-lead region 24 and second non-lead region 26 that are adjacent to each other. When a part of the fingerprint recognition region 2 is located in the first non-lead region 24 and another part of the fingerprint recognition region 2 is located in the second non-lead region 26, the number of the touch lines 6 penetrating the fingerprint recognition region 2 can be reduced, so as to not only make the touch lines 6 shield the fingerprint recognition region 2 less to improve the light transmittance of the fingerprint recognition region 2 to enable more detection light to enter the light-transmitting aperture 3 through the fingerprint recognition region 2, but also to increase the number of sub-pixel spacing regions 7 where the light-transmitting apertures 3 is provided in the fingerprint recognition region 2. For example, when a part of the fingerprint recognition region 2 is located in the first non-lead region 24 and the remaining part of the fingerprint recognition region 2 is located in the second non-lead region 26, there are no touch lines 6 passing through the fingerprint recognition region 2. In this case, all sub-pixel spacing regions 7 in the fingerprint recognition region 2 each can be provided with the light-transmitting apertures 3, thereby achieving a maximum distribution density of the light-transmitting apertures 3.

Figure 13:
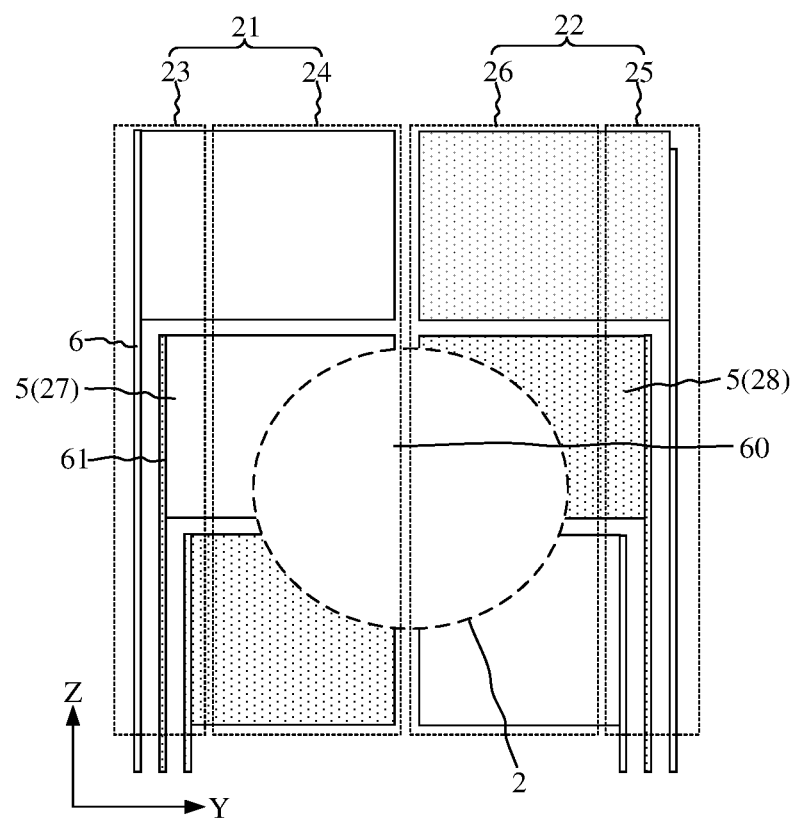
FIG. 13 is a schematic diagram showing arrangement positions of touch lines according to another embodiment of the present disclosure.

FIG. 13 is a schematic diagram showing arrangement positions of touch lines 6 according to another embodiment of the present disclosure. In some embodiments, as shown in FIG. 13, the touch electrodes 5 include a first touch electrode 27 and a second touch electrode 28. The first touch electrode 27 is located in a first region 21, and overlaps with the fingerprint recognition region 2 in a direction perpendicular to the plane of the display panel. A side of the first touch electrode 27 away from the fingerprint recognition region 2 is electrically connected to the touch line 6. The second touch electrode 28 is located in the second region 22, and overlaps with the fingerprint recognition region 2 in the direction perpendicular to the plane of the display panel. A side of the second touch electrode 28 away from the fingerprint recognition region 2 is electrically connected to the touch line 6.

Taking the first touch electrode 27 as an example, referring to FIG. 13 again, the side of the first touch electrode 27 away from the fingerprint recognition region 2 refers to: in a direction parallel to the plane of the display panel, the first touch electrode 27 includes a first side 60 and a second side 61 that are opposite to each other in the second direction Y. The first side 60 is a side of the first touch electrode 27 that overlaps with the fingerprint recognition region 2. The second side 61 that does not overlap with the fingerprint recognition region 2 is a side of the first touch electrodes 27 away from the fingerprint recognition region 2.

In the above configuration, the touch line 6 electrically connected to the first touch electrode 27 extends from a side of the first touch electrode 27 away from the fingerprint recognition region 2, and the touch line 6 electrically connected to the second touch electrode 28 extends from a side of the second touch electrode 28 away from the fingerprint recognition region 2, so that this touch lines 6 does not overlap with the fingerprint recognition region 2, which will neither shield the fingerprint recognition region 2 nor occupy the sub-pixel spacing region 7 in the fingerprint recognition region 2.

In the above configuration, the touch electrode 5 and the touch line 6 can be arranged in a same layer or in different layers.

In some embodiments, referring to FIG. 13 again, a distance L1 between the first lead region 23 and the second lead region 25 is greater than or equal to a maximum length L2 of the fingerprint recognition region 2 in the second direction Y. That is, a part of the fingerprint recognition region 2 is located in the first non-lead region 24 and the remaining part of the fingerprint recognition region 2 is located in the second non-lead region 26. The touch line 6 bypasses the fingerprint recognition region 2. The touch line 6 does not overlap with the fingerprint recognition region 2. Therefore, not only the light transmittance of the fingerprint recognition region 2 and the distribution density of the light-transmitting apertures 3 are improved, but also the touch lines 6 have a same length in the first lead region 23 and the second lead region 25 while preventing the touch line 6 from shielding the fingerprint recognition region 2, thereby making touch line 6 to carry a same load.

Figure 14:
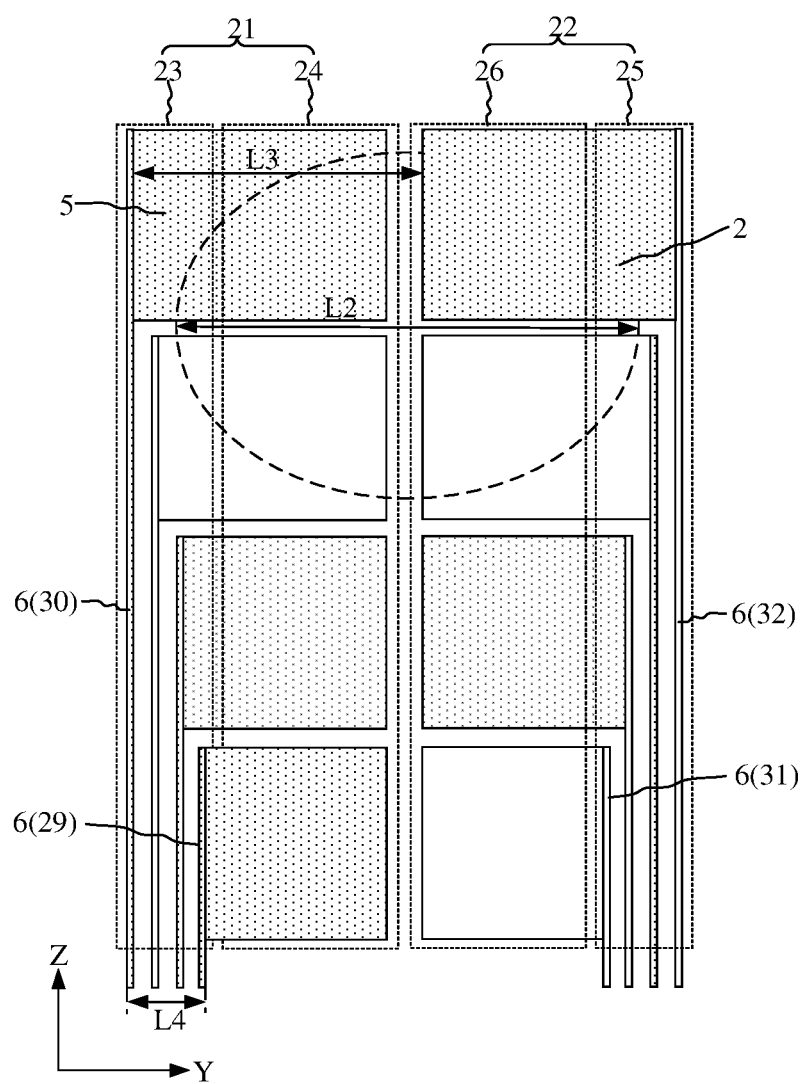
FIG. 14 is a schematic diagram of touch lines according to another embodiment of the present disclosure.

FIG. 14 is a schematic diagram of touch lines 6 according to another embodiment of the present disclosure. In some embodiments, as shown in FIG. 14, the touch lines 6 include a first touch line 29 and a second touch line 30. The first touch line 29 and the second touch line 30 are located in the first lead region 23. The first touch line 29 is located at a side of the second touch line 30 close to the first non-lead region 24. The first touch line 29 has a smaller length than the second touch line 30. A part of the fingerprint recognition region 2 is located in the first lead region 23. In some other embodiments, the touch lines 6 include a third touch line 31 and a fourth touch line 32. The third touch line 31 and the fourth touch line 32 are located in the second lead region 25. The third touch line 31 is located at a side of the fourth touch line 32 close to the second non-lead region 26. The third touch line 31 has a smaller length than the fourth touch line 32. A part of the fingerprint recognition region 2 is located in the second lead region 25.

Based on the above configuration of the touch lines 6, a distance between the second touch line 30 and the fourth touch line 32 is greater than a distance between the first touch line 29 and the third touch line 31, so that a larger area that is not passed through by the touch line 6 is formed between the second control lead 30 and the fourth touch line 32. Based on such structure, the fingerprint recognition region 2 can be located between the second touch line 30 and the fourth touch line 32. On the premise that the touch line 6 does not pass through the fingerprint recognition region 2, an area of the fingerprint recognition region 2 can be set larger. For example, the touch electrode 5 includes a first edge and a second edge opposite to each other in the second direction Y. A touch size refers to a distance between first edges of two adjacent touch electrodes 5. For example, a current touch size L3 is generally about 4 mm, and a total width L4 occupied by the touch line 6 in the first lead region 23 or in the second lead region 25 is about 1 mm. With such design, a maximum length L2 of the fingerprint recognition region 2 in the second direction Y can be increased to be greater than 6 mm.

In some embodiments, referring to FIG. 14 again, in the first region 21, lengths of the touch lines 6 decrease along a direction from the first lead region 23 to the first non-lead region 24; and/or, in the second region 22, the lengths of the touch lines 6 decrease along a direction from the second lead region 25 to the second non-lead region 26, so that the area of the fingerprint recognition region 2 can be set larger on the premise that the touch line 6 does not pass through the fingerprint recognition region 2. In some embodiments, as shown in FIG. 14, in the third direction Z, a part of the fingerprint recognition region 2 overlaps with the first touch line 29 located in the first lead region 23; and/or in the third direction Z, a part of the fingerprint recognition region 2 overlaps with the third touch line 31 located in the second lead region 25.

Figure 15:
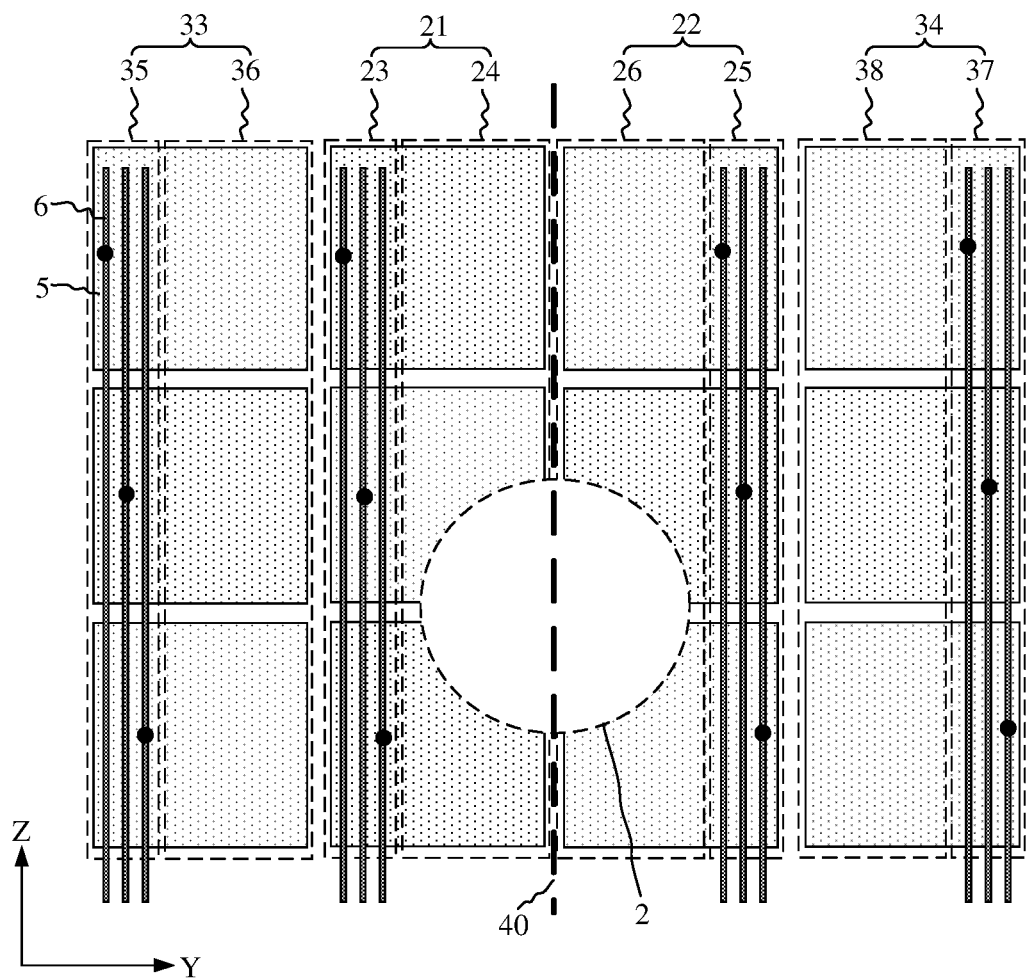
FIG. 15 is a schematic diagram showing arrangement positions of touch lines according to another embodiment of the present disclosure.
Figure 16:
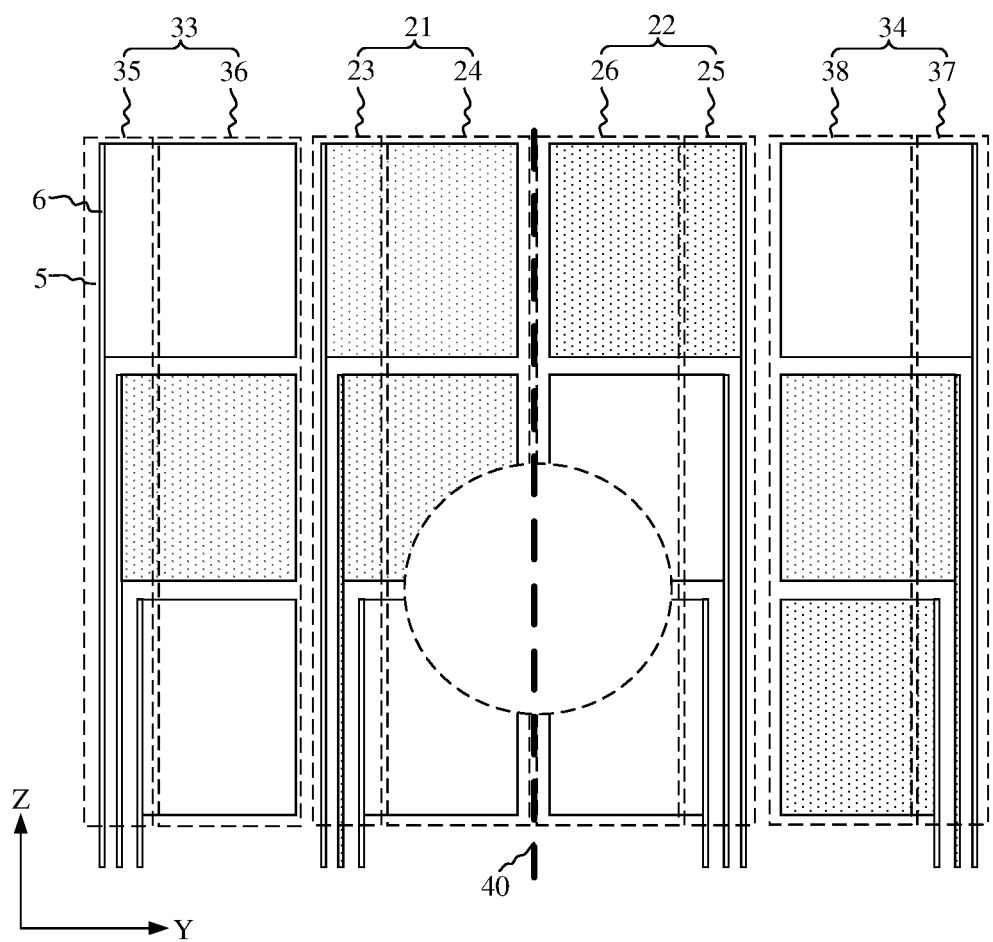
FIG. 16 is a schematic diagram showing arrangement positions of touch lines according to another embodiment of the present disclosure.

FIG. 15 is a schematic diagram showing arrangement positions of touch lines 6 according to another embodiment of the present disclosure, and FIG. 16 is a schematic diagram showing arrangement positions of touch lines 6 according to another embodiment of the present disclosure. In some embodiments, as shown in FIG. 15 and FIG. 16, the display region 1 includes at least one third region 33 and at least one fourth region 34. The third region 33 is located at a side of the first region 21 away from the second region 22. The fourth region 34 is located at a side of the second region 22 away from the first region 21.

The third region 33 includes a third lead region 35 and a third non-lead region 36 that are arranged along a second direction Y. A direction from the third lead region 35 to the third non-lead region 36 is same as a direction from the first lead region 23 to the first non-lead region 24. The touch lines 6 in the third region 33 are located in the third lead region 35. The fourth region 34 includes a fourth lead region 37 and a fourth non-lead region 38 that are arranged along the second direction Y. A direction from the fourth lead region 37 to the fourth non-lead region 38 is same as a direction from the second lead region 25 to the second non-lead region 26. The touch lines 6 in the fourth region 34 are located in the fourth lead region 37.

With such configuration, for the first region 21 and the third region 33 that are located at one side of the fingerprint recognition region 2, the touch lines 6 in the first region 21 are located at a side of the first region 21 away from the second region 22, and the touch lines 6 in the third region 33 are located at a side of the third region 33 away from the second region 22. For the second region 22 and the fourth region 34 that are located at another side of the fingerprint recognition region 2, the touch lines 6 in the second region 22 are located at a side of the second region 22 away from the first region 21, and the touch lines 6 in the fourth region 34 are located at a side of the fourth region 34 away from the first region 21. The touch lines 6 at two sides of the fingerprint recognition region 26 tend to be symmetrically distributed, and the arrangement of the touch lines 6 is more regular. With such configuration, the distributions of the touch lines 6 in different regions are consistent, thereby improving the reflection uniformity of the touch lines 6 in different regions for ambient light.

Figure 17:
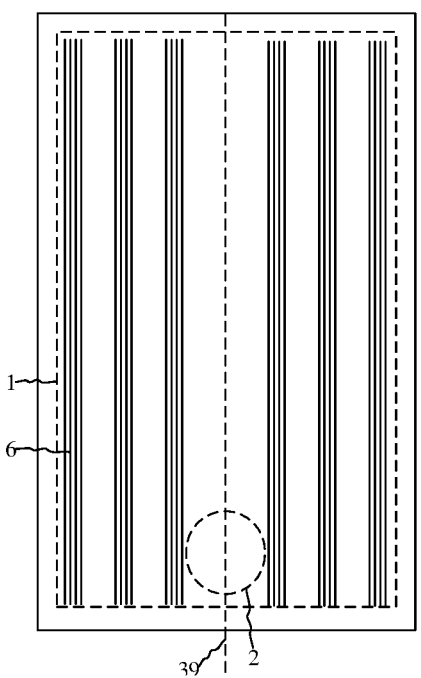
FIG. 17 is a schematic diagram showing arrangement positions of touch lines according to another embodiment of the present disclosure.

FIG. 17 is a schematic diagram showing arrangement positions of touch lines 6 according to another embodiment of the present disclosure. In some embodiments, as shown in FIG. 17, the display region 1 has a first central axis 39. In order to improve the regular arrangement of the touch lines 6 and the uniformity of reflection, the touch lines 6 can be symmetrical about the first central axis 39.

In some embodiments, referring to FIG. 15 and FIG. 16 again, the fingerprint recognition region 2 has a second central axis 40. In order to improve a regular arrangement of the touch lines 6 and uniformity of reflection, the first touch lines 6 in the first lead region 23 are symmetrically arranged with the touch lines 6 in the second lead region 25 about the second central axis 40.

In some embodiments of the present disclosure, the second central axis 40 of the fingerprint recognition region 2 can coincide with the first central axis 39 of the display region 1.

Figure 18:
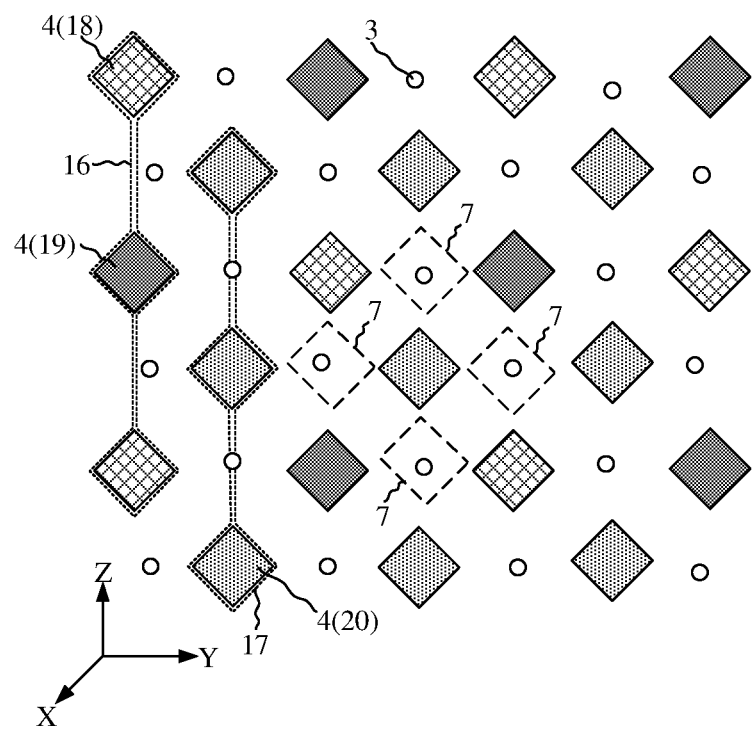
FIG. 18 is a schematic diagram showing arrangement positions of light-transmitting apertures according to another embodiment of the present disclosure.
Figure 19:
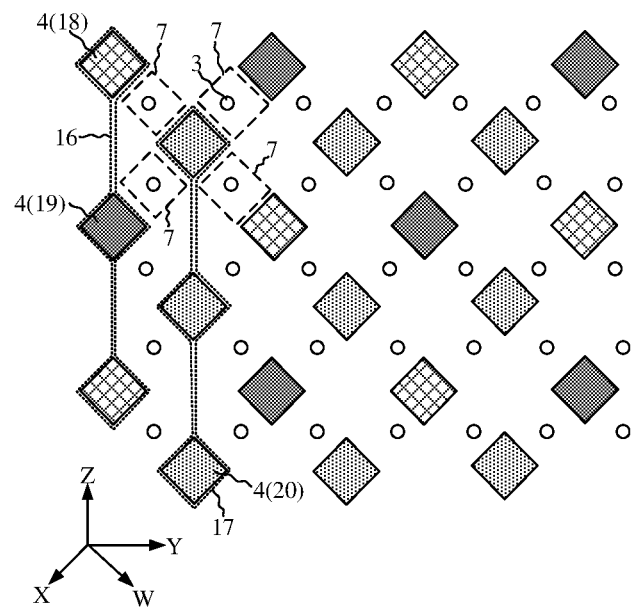
FIG. 19 is a schematic diagram showing arrangement positions of light-transmitting apertures according to another embodiment of the present disclosure.

FIG. 18 is a schematic diagram showing arrangement positions of light-transmitting apertures 3 according to another embodiment of the present disclosure, FIG. 19 is a schematic diagram showing arrangement positions of light-transmitting apertures 3 according to another embodiment of the present disclosure. In some embodiments, as shown in FIG. 18 and FIG. 19, the display panel includes first pixel groups 16 and second pixel groups 17 that are alternately arranged along the second direction Y. The first pixel group 16 includes first sub-pixels 18 and second sub-pixels 19 that are alternately arranged along the third direction Z. The second pixel group 17 includes multiple third sub-pixels 20 that are arranged along the third direction Z. The second direction Y intersects with the third direction Z. In the second direction Y, the third sub-pixels 20 are not aligned with the first sub-pixels 18 or the second sub-pixels 19.

Referring to FIG. 18, the light-transmitting aperture 3 is located in the sub-pixel spacing region 7 adjacent to the third sub-pixel 20 in the second direction Y and the third direction Z. In some embodiments, referring to FIG. 19, the light-transmitting apertures 3 are located in the sub-pixel spacing region 7 adjacent to the third sub-pixel 20 in the first direction X and the sub-pixel spacing region 7 adjacent to the third sub-pixel 20 in the fourth direction W, respectively. The first direction X intersects with the second direction Y and the third direction Z. The fourth direction W intersects with the second direction Y and the third direction Z.

When the touch line 6 does not pass through the fingerprint recognition region 2, the distribution density of the light-transmitting apertures 3 in the fingerprint recognition region 2 can be larger. When the light-transmitting apertures 3 are arranged in the above manner, the distribution of the light-transmitting apertures 3 in the fingerprint recognition region 2 is more uniform while ensuring a larger distribution density of the light-transmitting apertures 3, thereby achieving a better uniformity of the amount of detection light collected by the optical sensors at different positions.

In some embodiments, referring to FIG. 4 again, the touch electrode 5 includes a first hollow portion 41. In the direction perpendicular to the plane of the display panel, the first hollow portion 41 overlaps with the sub-pixel 4, so that the touch electrode 5 exposes the sub-pixel 4 and does not shield the sub-pixel 4, thereby improving the luminous efficiency of the display panel. The touch electrode 5 can be made of a light-transmitting conductive material such as ITO, or can be made of a metal material with low resistance.

Figure 20:
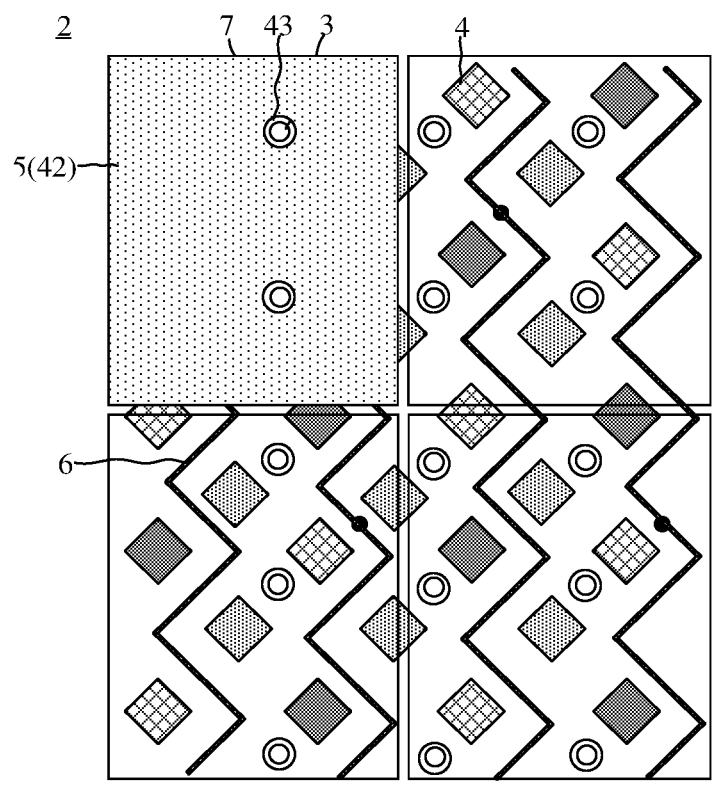
FIG. 20 is a schematic diagram of touch electrodes according to another embodiment of the present disclosure.

FIG. 20 is a schematic diagram of touch electrodes 5 according to another embodiment of the present disclosure. In some embodiments, as shown in FIG. 20, the touch electrode 5 includes a first-type touch electrode 42 located in the fingerprint recognition region 2. At least one first-type touch electrode 42 includes a second hollow portion 43. The second hollow portion 43 overlaps with the light-transmitting aperture 3 in the direction perpendicular to the plane of the display panel, so that the touch electrode 5 exposes the light-transmitting apertures 3 to make the touch electrode 5 shield the light-transmitting aperture 3 less, thereby increasing the amount of detection light entering the optical sensor through the light-transmitting aperture 3, and improving the fingerprint recognition accuracy.

Figure 21:
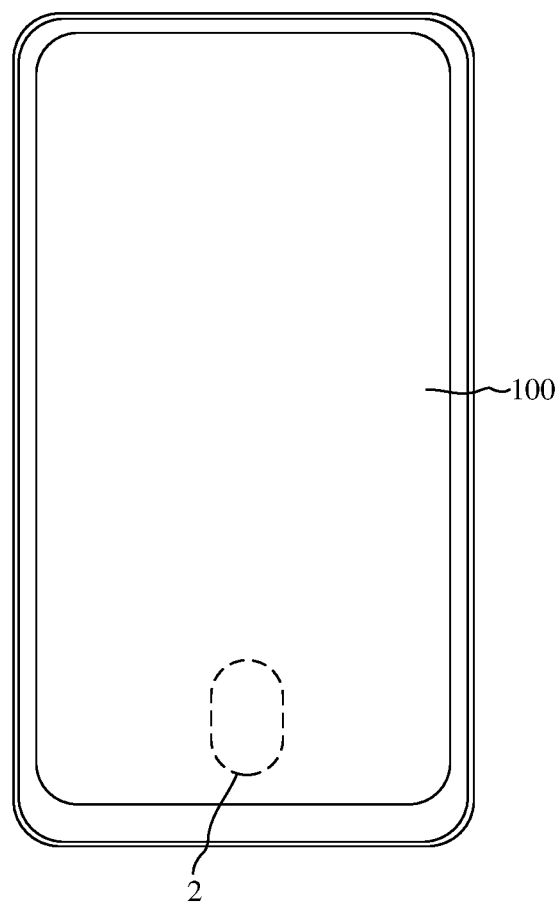
FIG. 21 is a schematic diagram of a display apparatus according to some embodiments of the present disclosure.

The present disclosure provides a display apparatus. FIG. 21 is a schematic diagram of a display apparatus according to some embodiments of the present disclosure. As shown in FIG. 21, the display apparatus includes the display panels 100 mentioned above. The specific structure of the display panel 100 has been described in detail in the above embodiments, and will not be repeated herein. The display apparatus shown in FIG. 21 is only a schematic illustration, and the display apparatus can be any electronic device with a display function, such as a mobile phone, a tablet computer, a laptop computer, an electronic paper book, or a television.

The above are merely some embodiments of the present disclosure, which are not used to limit the present disclosure. Any modification, equivalent replacement, improvement, and the like made within the principles of the present disclosure shall fall within the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, having a display region and comprising:
   a plurality of sub-pixels located in the display region;
   a plurality of touch electrodes located in the display region; and
   a plurality of touch lines located in the display region,
   wherein the display region comprises a fingerprint recognition region, and the fingerprint recognition region comprises a plurality of light-transmitting apertures; and
   wherein the display region comprises a plurality of sub-pixel spacing regions, the light-transmitting aperture is provided to correspond to one of the plurality of sub-pixel spacing regions, the touch line is provided to correspond to one of the plurality of sub-pixel spacing regions, there is no light-transmitting aperture provided between at least a part of the touch lines and the sub-pixels, and the light-transmitting apertures are not directly connected to the sub-pixels.

2. The display panel according to claim 1, wherein the plurality of sub-pixels comprises a first-type sub-pixel located in the fingerprint recognition region, and one of the plurality of light-transmitting apertures is provided in at least one sub-pixel spacing region of the plurality of sub-pixel spacing regions that is adjacent to the first-type sub-pixel.

3. The display panel according to claim 1, wherein the plurality of sub-pixels comprises a plurality of first-type sub-pixels located in the fingerprint recognition region, the plurality of sub-pixel spacing regions comprises a plurality of first-type sub-pixel spacing regions, and one of the plurality of first-type sub-pixel spacing regions is located between two first-type sub-pixels of the plurality of first-type sub-pixels that are adjacent to each other in a first direction; and
   at least one of the plurality of light-transmitting apertures is located in at least one of the plurality of first-type sub-pixel spacing regions.

4. The display panel according to claim 1, wherein the display panel comprises a plurality of pixel groups arranged along a second direction, wherein at least one of the plurality of pixel groups each comprises a plurality of sub-pixels arranged along a third direction, and wherein the second direction intersects with the third direction:
   wherein the display region comprises a plurality of pixel group spacing regions, wherein each of the plurality of pixel group spacing regions is located between the sub-pixels of two adjacent pixel groups of the plurality of pixel groups; and
   wherein the plurality of pixel group spacing regions comprises a plurality of first-type pixel group spacing regions and a plurality of second-type pixel group spacing regions, wherein the plurality of touch lines is located in the plurality of first-type pixel group spacing regions, and the plurality of light-transmitting apertures is located in the plurality of second-type pixel group spacing regions.

5. The display panel according to claim 4, wherein the plurality of first-type pixel group spacing regions and the plurality of second-type pixel group spacing regions are alternately arranged along the second direction.

6. The display panel according to claim 4, wherein the plurality of second-type pixel group spacing regions is arranged at equal intervals.

7. The display panel according to claim 4, wherein at least three of the plurality of light-transmitting apertures are arranged at equal intervals in one of the plurality of second-type pixel group spacing regions.

8. The display panel according to claim 4, wherein the plurality of pixel groups comprises a plurality of first pixel groups and a plurality of second pixel groups, wherein that are arranged alternately in sequence along the second direction:
   wherein each of the plurality of first pixel groups comprises a plurality of first sub-pixels and a plurality of second sub-pixels that are alternately arranged along the third direction, each of the plurality of second pixel groups comprises a plurality of third sub-pixels arranged along the third direction, and, the plurality of third sub-pixels is aligned with none of the plurality of first sub-pixels and the plurality of second sub-pixels in the second direction; and
   wherein one of the plurality of light-transmitting apertures is located between one of the plurality of third sub-pixels and one of the plurality of first sub-pixels that is adjacent to the third sub-pixel in the first direction, and/or located between one third sub-pixel of the plurality of third sub-pixels and one of the plurality of second sub-pixels that is adjacent to the one third sub-pixel in the first direction, and the first direction intersects with the second direction and the third direction.

9. The display panel according to claim 1, wherein the display region comprises a first region and a second region that are adjacent to each other in a second direction, the first region comprises a first lead region and a first non-lead region that are arranged along the second direction, the second region comprises a second lead region and a second non-lead region that are arranged along the second direction, and the first non-lead region and the second non-lead region are adjacent to each other; and
   wherein one of the plurality of touch lines that is electrically connected to one of the plurality of touch electrodes in the first region is located in the first lead region, and one of the plurality of touch lines that is electrically connected to one of the plurality of touch electrodes in the second region is located in the second lead region, and a part of and another part of the fingerprint recognition region are located in the first non-lead region and the second non-lead region, respectively.

10. The display panel according to claim 9, wherein the plurality of touch electrodes comprises a first touch electrode and a second touch electrode;
    wherein the first touch electrode is located in the first region, and overlaps with the fingerprint recognition region in a direction perpendicular to a plane of the display panel, and a side of the first touch electrode away from the fingerprint recognition region is electrically connected to one of the plurality of touch lines; and wherein the second touch electrode is located in the second region, and overlaps with the fingerprint recognition region in the direction perpendicular to the plane of the display panel, and a side of the second touch electrode away from the fingerprint recognition region is electrically connected to one of the plurality of touch lines.

11. The display panel according to claim 9, wherein a distance between the first lead region and the second lead region is greater than or equal to a maximum length of the fingerprint recognition region in the second direction.

12. The display panel according to claim 9, wherein the plurality of touch lines comprises a first touch line and a second touch line that are located in the first lead region, the first touch line is located at a side of the second touch line close to the first non-lead region, the first touch line has a smaller length than the second touch line, and the fingerprint recognition region is partially located in the first touch line region; and/or wherein the plurality of touch lines comprises a third touch line and a fourth touch line that are located in the second lead region, the third touch line is located at a side of the fourth touch line close to the second non-lead region, the third touch line has a smaller length than the fourth touch line, and the fingerprint recognition region is partially located in the second touch line region.

13. The display panel according to claim 12, wherein the display panel comprises a plurality of pixel groups arranged along a second direction, wherein at least one of the plurality of pixel groups each comprises a plurality of sub-pixels arranged along a third direction, and the second direction intersects with the third direction:

wherein in the third direction, a part of the fingerprint recognition region overlaps with the first touch line located in the first lead region; and/or wherein in the third direction, a part of the fingerprint recognition region overlaps with the third touch line located in the second lead region.

14. The display panel according to claim 9, wherein the display region further comprises at least one third region and at least one fourth region, the at least one third region is located at a side of the first region away from the second region, and the at least one fourth region is located at a side of the second region away from the first region:

wherein one of the at least one third region comprises a third lead region and a third non-lead region that are arranged along the second direction, a direction from the third lead region to the third non-lead region is the same as a direction from the first lead region to the first non-lead region, and one of the plurality of touch lines in the third region is located in the third lead region; and wherein one of the at least one fourth region comprises a fourth lead region and a fourth non-lead region that are arranged along the second direction, a direction from the fourth lead region to the fourth non-lead region is the same as a direction from the second lead region to the second non-lead region, and one of the plurality of touch lines in the fourth region is located in the fourth lead region.

15. The display panel according to claim 9, wherein the display region has a first central axis about which the plurality of touch lines is symmetrically arranged.

16. The display panel according to claim 9, wherein the fingerprint recognition region has a second central axis about which at least one of the plurality of touch lines in the first lead region and another at least one of the plurality of touch lines in the second lead region are symmetrically arranged.

17. The display panel according to claim 9, wherein the display panel further comprises a plurality of first pixel groups and a plurality of second pixel groups that are alternately arranged in sequence along the second direction, one of the plurality of first pixel groups comprises a plurality of first sub-pixels and a plurality of second sub-pixels that are alternately arranged along a third direction intersecting with the second direction, one of the plurality of second pixel groups comprises a plurality of third sub-pixels arranged along the third direction:

wherein the plurality of third sub-pixels is aligned with none of the plurality of first sub-pixels and the plurality of second sub-pixels in the second direction; and wherein one of the plurality of light-transmitting apertures is located in one of the plurality of sub-pixel spacing regions that is adjacent to one of the plurality of third sub-pixels in the second direction and the third direction, or, one of the plurality of light-transmitting apertures is located in one of the plurality of sub-pixel spacing regions that is adjacent to one of the plurality of third sub-pixels in the first direction and the fourth direction, the first direction intersecting with both the second direction and the third direction, and the fourth direction intersecting with both the second direction and the third direction.

18. The display panel according to claim 1, wherein one of the plurality of touch electrodes comprises a first hollow portion that overlaps with one of the plurality of sub-pixels in a direction perpendicular to a plane of the display panel.

19. The display panel according to claim 1, wherein the plurality of touch electrodes comprises at least one first-type touch electrode located in the fingerprint recognition region, one of the at least one first-type touch electrode comprises a second hollow portion, and the second hollow portion overlaps with one of the plurality of light-transmitting apertures in a direction perpendicular to a plane of the display panel.

20. The display panel according to claim 1, wherein at least one of the plurality of touch lines and at least one of the plurality of light-transmitting apertures are respectively provided in at least two sub-pixel spacing regions of the plurality of sub-pixel spacing regions that are respectively located at different sides of at least one sub-pixel of the plurality of sub-pixels.

21. The display panel according to claim 1, wherein at least two sub-pixels of the plurality of sub-pixels are arranged in a first direction, at least two sub-pixels of the plurality of sub-pixels are arranged in a fourth direction, and at least two touch lines of the plurality of touch lines are arranged in a third direction, wherein the third direction intersects both the first direction and the fourth direction.

22. The display panel according to claim 21, wherein one touch line of the plurality of touch lines comprises first segments and second segments, wherein the first segments each extend along the first direction, and the second segments each extend along the fourth direction.

23. The display panel according to claim 22, wherein the first segments and the second segments are alternatively arranged to form the touch line having a shape of a zigzag line.

24. The display panel according to claim 1, wherein at least one of the plurality of touch electrodes is a self-capacitance touch electrode.

25. A display apparatus, comprising a display panel, wherein the display panel has a display region and comprises:
- a plurality of sub-pixels located in the display region;
- a plurality of touch electrodes located in the display region; and
- a plurality of touch lines located in the display region and respectively electrically connected to the plurality of touch electrodes,
- wherein the display region comprises a fingerprint recognition region, and the fingerprint recognition region comprises a plurality of light-transmitting apertures; and
- wherein the display region comprises a plurality of sub-pixel spacing regions, the light-transmitting aperture is provided to correspond to one of the plurality of sub-pixel spacing regions, the touch line is provided to correspond to one of the plurality of sub-pixel spacing regions, there is no light-transmitting aperture provided between at least a part of the touch lines and the sub-pixels, and the light-transmitting apertures are not directly connected to the sub-pixels.

* * * * *